United States Patent
Yamaura et al.

(10) Patent No.: US 9,932,471 B2
(45) Date of Patent: *Apr. 3, 2018

(54) CROSSLINKING RESIN COMPOSITION AND SEALING MATERIAL

(71) Applicant: NIPPON KASEI CHEMICAL COMPANY LIMITED, Iwaki-shi, Fukushima-ken (JP)

(72) Inventors: Mabuko Yamaura, Iwaki (JP); Yukio Orikasa, Iwaki (JP); Kazuya Senzaki, Iwaki (JP)

(73) Assignee: NIPPON KASEI CHEMICAL COMPANY LIMITED, Iwaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/768,098

(22) PCT Filed: Feb. 21, 2014

(86) PCT No.: PCT/JP2014/054127
§ 371 (c)(1),
(2) Date: Aug. 14, 2015

(87) PCT Pub. No.: WO2014/129574
PCT Pub. Date: Aug. 28, 2014

(65) Prior Publication Data
US 2015/0376389 A1    Dec. 31, 2015

(30) Foreign Application Priority Data
Feb. 21, 2013    (JP) ................................. 2013-032283

(51) Int. Cl.
| | | |
|---|---|---|
| *H01L 31/048* | (2014.01) | |
| *C08L 31/04* | (2006.01) | |
| *C09K 3/10* | (2006.01) | |
| *C08F 299/06* | (2006.01) | |
| *C08K 5/00* | (2006.01) | |
| *C09J 123/08* | (2006.01) | |

(52) U.S. Cl.
CPC .......... *C08L 31/04* (2013.01); *C08F 299/065* (2013.01); *C08K 5/0025* (2013.01); *C09J 123/0853* (2013.01); *C09K 3/10* (2013.01); *C09K 3/1021* (2013.01); *H01L 31/0481* (2013.01); *C08L 2203/204* (2013.01); *C08L 2312/00* (2013.01); *C09K 2200/062* (2013.01); *C09K 2200/0622* (2013.01); *Y02E 10/50* (2013.01)

(58) Field of Classification Search
CPC ....................................................... C08L 31/04
See application file for complete search history.

(56) References Cited

U.S. PATENT DOCUMENTS

| | | | | |
|---|---|---|---|---|
| 5,283,101 | A * | 2/1994 | Li | G02B 5/128 2/244 |
| 5,679,722 | A | 10/1997 | Tamura | |
| 5,754,338 | A * | 5/1998 | Wilson | B29C 65/608 359/529 |
| 2011/0214738 | A1* | 9/2011 | Halahmi | H01L 31/048 136/259 |
| 2012/0080068 | A1* | 4/2012 | Bae | C09J 9/02 136/244 |
| 2012/0107995 | A1* | 5/2012 | Niiyama | H01L 31/048 438/64 |
| 2012/0309878 | A1 | 12/2012 | Inoue et al. | |
| 2013/0068299 | A1* | 3/2013 | Okaniwa | C08F 2/44 136/257 |
| 2013/0074928 | A1* | 3/2013 | Sawaki | H01L 31/0481 136/257 |
| 2013/0092318 | A1 | 4/2013 | Saito et al. | |
| 2013/0125985 | A1* | 5/2013 | Sawaki | H01L 31/0481 136/259 |
| 2015/0353784 | A1 | 12/2015 | Yamaura et al. | |

FOREIGN PATENT DOCUMENTS

| | | |
|---|---|---|
| CN | 102762652 | 10/2012 |
| EP | 2 960 291 | 12/2015 |
| JP | 56-159207 | 12/1981 |
| JP | 60-226589 | 11/1985 |
| JP | 4-126711 | 4/1992 |
| JP | 8-20620 | 1/1996 |
| JP | 8-259907 | 10/1996 |
| JP | 2003-51605 | 2/2003 |
| JP | 2007-123488 | 5/2007 |
| JP | 2008-24862 | 2/2008 |
| JP | 2008-144067 | 6/2008 |
| JP | 2009-135200 | 6/2009 |
| JP | 2010-73720 | 4/2010 |
| JP | 2013-112787 | 6/2013 |

OTHER PUBLICATIONS

International Search Report issued in PCT/JP2014/054127 dated Aug. 25, 2015.
International Search Report for PCT/JP2014/054127, dated May 20, 2014, 4 pages.
Extended European Search Report issued App. No. 14754765.7 dated Sep. 21, 2016.

* cited by examiner

*Primary Examiner* — Irina Krylova
(74) *Attorney, Agent, or Firm* — Nixon & Vanderhye P.C.

(57) ABSTRACT

The present invention provides a crosslinking resin composition comprising an ethylene copolymer and a crosslinking aid, in which the crosslinked product of the resin composition has excellent insulation properties (volume resistivity value). The present invention provides a heat-crosslinking resin composition comprising an ethylene copolymer, a crosslinking agent and a urethane poly(meth)acrylate as a crosslinking aid, and (2) a radiation-crosslinking resin composition comprising an ethylene copolymer and a urethane poly(meth)acrylate as a crosslinking aid.

2 Claims, No Drawings

CROSSLINKING RESIN COMPOSITION AND SEALING MATERIAL

This application is the U.S. national phase of International Application No. PCT/JP2014/054127 filed 21 Feb. 2014, which designated the U.S. and claims priority to JP Patent Application No. 2013-32283 filed 21 Feb. 2013, the entire contents of each of which are hereby incorporated by reference.

TECHNICAL FIELD

The present invention relates to a crosslinking resin composition and a sealing material. More specifically, the present invention relates to a crosslinking resin composition comprising an ethylene copolymer and a specific crosslinking aid, and a sealing material comprising the crosslinking resin composition which is used for a solar cell, etc.

BACKGROUND ART

Conventionally, as a sealing material used for assembly of various kinds of electronic material modules, there has been proposed a resin composition comprising an ethylene-based copolymer as a base material and an organic peroxide as a crosslinking agent (Patent Literature 1).

In addition, there has been proposed an adhesive sheet for a solar cell which is constituted of 100 parts by weight of an ethylene-based copolymer and 0.05 to 0.5 part by weight of an organic peroxide, and comprises a multifunctional monomer having four or more acryloyl and/or methacryloyl groups in total (Patent Literature 2).

Further, there has been proposed a sealing film for a solar cell which comprises an ethylene-unsaturated ester copolymer, a crosslinking agent and a crosslinking aid, in which the crosslinking aid comprises a polyfunctional (meth)acrylate of a polyhydric alcohol and TAIC (Patent Literature 3).

Meanwhile, in the sealing material using an ethylene copolymer as a resin, particularly, insulation properties (volume resistivity value) thereof come into question. In this point of view, the above conventional proposals are not necessarily sufficient.

CITATION LIST

Patent Literatures

Patent Literature 1: Japanese Patent Application Laid-Open (KOKAI) No. 60-226589(1985)
Patent Literature 2: Japanese Patent Application Laid-Open (KOKAI) No. 2007-123488
Patent Literature 3: Japanese Patent Application Laid-Open (KOKAI) No. 2009-135200

SUMMARY OF THE INVENTION

Problems to be Solved by the Invention

The present invention has been accomplished in view of the above circumstances. The object of the present invention is to provide a crosslinking resin composition comprising an ethylene copolymer and a crosslinking aid, in which a crosslinked product of the resin composition has excellent insulation properties (volume resistivity value).

Means for Solving the Problems

As a result of the present inventors' earnest study to achieve the above object, it has been found that the above object of the present invention can be achieved by compounding a specific crosslinking aid in an ethylene copolymer.

That is, in a first aspect of the present invention, there is provided a heat-crosslinking resin composition comprising an ethylene copolymer, a crosslinking agent and a urethane poly(meth)acrylate as a crosslinking aid. In a second aspect of the present invention, there is provided a radiation-crosslinking resin composition comprising an ethylene copolymer and a urethane poly(meth)acrylate as a crosslinking aid. In a third aspect of the present invention, there is provided a sealing material comprising the above-defined respective crosslinking resin compositions.

Effect of the Invention

According to the present invention, the above problem can be achieved.

EMBODIMENTS FOR CARRYING OUT THE INVENTION

<Ethylene Copolymer>

The ethylene copolymer is a copolymer of ethylene as a main component and a monomer that is copolymerizable with the ethylene. Examples of the monomer include vinyl esters, unsaturated carboxylic acid esters, unsaturated carboxylic acids and metal salts thereof, unsaturated silicon compounds, α-olefins and the like. As the copolymerizable monomers, polar monomers are preferred. Specific examples of the ethylene copolymer include ethylene-vinyl ester copolymers such as ethylene-vinyl acetate copolymers, ethylene-unsaturated carboxylic acid ester copolymers such as ethylene-methyl acrylate copolymers and ethylene-isobutyl acrylate-methacrylic acid copolymers, and ionomers thereof. Of these ethylene copolymers, particularly preferred are the ethylene-vinyl acetate copolymers.

<Crosslinking Aid>

The crosslinking resin composition according to the present invention comprises an ethylene copolymer and a urethane poly(meth)acrylate as a crosslinking aid. The urethane poly(meth)acrylate can be synthesized, for example, from an organic isocyanate and a hydroxyl group-containing (meth)acrylate. The urethane poly(meth)acrylate having a high molecular weight is preferred. The average molecular weight of the urethane poly(meth)acrylate is not less than 100, and preferably not less than 1200.

The organic isocyanate is a compound having two or more isocyanate groups in a molecule thereof. Examples of the organic group include a linear, branched or cyclic aliphatic hydrocarbon group, an aromatic hydrocarbon group, a heterocyclic ring group such as an isocyanurate group. Specific examples of the organic isocyanate include 1,6-hexamethylene diisocyanate, isophorone diisocyanate, toluidine diisocyanate, MDI (diphenylmethane diisocyanate), hydrogenated MDI, xylylene diisocyanate, a trimer of 1,6-hexamethylene diisocyanate, a trimer of isophorone diisocyanate, and the like.

The hydroxyl group-containing (meth)acrylate is a (meth)acrylate having one or more hydroxyl groups in a molecule thereof. Examples of the hydroxyl group-containing (meth)acrylate include (meth)acrylates of polyhydric alcohols. Specific examples of the hydroxyl group-containing (meth)acrylate include trimethylolpropane di(meth)acrylate, pentaerythritol tri(meth)acrylate, dipentaerythritol tetra(meth)acrylate, tripentaerythritol (meth)acrylate, polyalkyl diol (meth)acrylates, polyethylene glycol (meth)acrylate, polyalkylene glycol (meth)acrylates, glycerin di(meth)acrylate and polyol (meth)acrylates. These hydroxyl group-containing (meth)acrylates may be in the form of a single acrylate or a mixture of these acrylates.

Examples of commercially available products of the urethane poly(meth)acrylate include "UA-306H", "UA-306T", "UA-306I" and "UA-510H" all produced by Kyoeisha Chemical Co., Ltd., "KRM7864", "KRM8452", "EB1290", "EB1290K" and "EB5129" all produced by Daicel Cytec Co., Ltd., "U-6HA", "U-6LPA", "UA-33H", "U-15HA" and "UA-122P" all produced by Shin-Nakamura Chemical Co., Ltd., "UV7600B", "UV7605B", "UV7610B" and "UV7620EA" all produced by Nippon Synthetic Co., and the like.

<Other Crosslinking Aid>

In the present invention, the other crosslinking aid, for example, a polyfunctional (meth)acrylate may also be used in combination with the aforementioned crosslinking aid, unless the effects of the present invention are adversely affected by addition thereof. The polyfunctional (meth) acrylate is a compound having two or more (meth)acryloyl groups, and preferably three (meth)acryloyl groups, in a molecule thereof. Specific examples of the polyfunctional (meth)acrylate include trimethylolpropane tri(meth)acrylate, dimethylol propane tetra(meth)acrylate, pentaerythritol tri(meth)acrylate, pentaerythritol tetra(meth)acrylate, dipentaerythritol penta(meth)acrylate, dipentaerythritol hexa(meth)acrylate, and the like.

<Crosslinking Agent>

In the heat-crosslinking, a crosslinking agent is used together with the crosslinking aid. As the crosslinking agent, an organic peroxide may be generally used. The organic peroxide is not particularly limited as long as it is a known organic peroxide to generate peroxy radicals under the vulcanization conditions. Examples of the organic peroxide include di-t-butylperoxide, dicumylperoxide, 2,5-dimethyl-2,5-di(benzoylperoxy)hexane, 2,5-dimethyl-2,5-di(t-butylperoxy)hexane, t-butylperoxy-2-ethylhexyl-monocarbonate, 1,1-bis(t-butylperoxy)-3,5,5-trimethyl cyclohexane, 2,5-dimethylhexane-2,5-dihydroxyperoxide, t-butylcumylperoxide, α, α'-bis(t-butylperoxy)-p-diisopropyl benzene, 2,5-dimethyl-2,5-di(t-butylperoxy)hexyne-3, benzoylperoxide, t-butylperoxy benzene, and the like.

The amount of the urethane poly(meth)acrylate as the crosslinking aid compounded in the crosslinking resin composition of the present invention is usually 0.1 to 3.0 parts by weight, and preferably 0.5 to 2.0 parts by weight based on 100 parts by weight of the ethylene copolymer. In addition, when using the polyfunctional (meth)acrylate as the other crosslinking aid in combination with the above crosslinking aid, the amount of the polyfunctional (meth) acrylate compounded is usually 0.1 to 3.0 parts by weight, and preferably 0.5 to 2.0 parts by weight based on 100 parts by weight of the ethylene copolymer.

The amount of the crosslinking agent compounded may vary depending on the type of the ethylene copolymer, and is usually 0.6 to 5 parts by weight, and preferably 1 to 2 parts by weight based on 100 parts by weight of the ethylene copolymer. In such a case as to carry out crosslinking by irradiation, the organic peroxide is not necessarily required.

In the crosslinking resin composition of the present invention, for example, optional additives such as reinforcing agents, fillers, plasticizers, processing aids, lubricants, pigments, anti-aging agents, coupling agents, ultraviolet absorbers and acid acceptors can be used.

Specific examples of the anti-aging agents include di-t-butyl-P-cresol, pentaerythrityl-tetraxy[3-(3,5-di-t-butyl-4-hydroxyphenyl)propionate], 2,2'-methylenebis(2-methyl-6-t-butylphenyl), bis(2,2,6,6-tetramethyl-4-piperadyl) sebacate, N,N'-hexane-1,6-diylbis[3-(3,5-di-tert-butyl-4-hydroxyphenyl)propionamide], bis(2,2,6,6-tetramethyl-4-piperadyl)sebacate, hydroquinone monomethyl ether, methylhydroquinone, and the like.

Specific examples of the coupling agents include γ-chloropropyl trimethoxysilane, vinyl triethoxysilane, vinyl-tris-(β-methoxyethoxy)silane, γ-methacryloxypropyl trimethoxysilane, β-(3,4-ethoxy-cyclohexyl)ethyl trimethoxysilane, γ-glycidoxypropyl trimethoxysilane, γ-mercaptopropyltrimethoxysilane, γ-aminopropyl trimethoxysilane, N-β-(aminoethyl)-γ-aminopropyl trimethoxysilane, and the like.

Specific examples of the ultraviolet absorbers include 2-hydroxy-4-n-octyloxy benzophenone, 2,2-hydroxy 6-4,4-dimethoxy benzophenone, 2-(2'-hydroxy-5-methylphenyl) benzotriazole, p-t-butylphenyl salicylate, and the like.

Specific examples of the acid acceptors include magnesium hydroxide, calcium hydroxide, magnesium oxide, zinc oxide, and the like.

The amount of the additives added is usually not more than 10 parts by weight, and preferably not more than 5 parts by weight based on 100 parts by weight of the ethylene copolymer.

<Crosslinking of Ethylene Copolymer Composition>

As the radiation used in the radiation-crosslinking, accelerated electron beams, X-rays, α rays, β rays, γ rays, and the like are available. The irradiation dose may vary depending on the cross-linkable elastomer to be used, and is usually 0.1 to 500 kGy. The heat-crosslinking is conducted by using a molding machine, for example, an injection molding machine, a compression molding machine and the like, and heating at a temperature of 150 to 200° C. for about 2 to 30 min to obtain a molded body. If necessary, thereafter, the secondary crosslinking may be conducted by heating at a temperature of 150 to 200° C. for 1 to 10 hr. As the crosslinking of the ethylene copolymer composition described above, particularly the crosslinking using an organic peroxide is preferred.

The above ethylene copolymer composition is useful for use in the applications such as various packaging materials for foods, pharmaceuticals, industrial chemicals, agricultural materials and the like, various adhesive films, sealing films for various electric materials such as solar cells, liquid crystal, light emitting diodes, organic EL and the like, as well as useful for use in fields of hemodialysis, plasma component separation, desalting of protein solutions, fractionation, condensation, condensation of fruit juice, wastewater treatment, and the like. In particular, the above ethylene copolymer composition is useful as a sealing material used for assembly of various electronic material modules. Incidentally, in the case of a sealing material to be used in a considerably thickened form such as a sealing material for the solar cell, the sealing material fails to be cured with ultraviolet rays and electron beams, and therefore, heat-curing is applied.

EXAMPLES

Next, the present invention is described in more detail below by the following Examples. However, these Examples are only illustrative and not intended to limit the present invention thereto.

Examples 1 and 2 and Comparative Example 1

Respective components shown in Table 1 below were kneaded with an open roll mill. EVA (ethylene-vinyl acetate copolymer) containing 32% by weight of vinyl acetate was used. Respective compounds shown in Table 2 were used as a crosslinking aid in each Example or Comparative Example. The resulting composition was subjected to hot press crosslinking (primary crosslinking) at 150° C. to obtain a sheet having a thickness of 1 mm. A volume resistivity value of the thus obtained sheet was measured by the method shown in Table 3. The measurement results are shown in Table 4.

TABLE 1

<Basic formulation>

| Components | Part(s) by weight |
|---|---|
| EVA | 100 |
| Organic peroxide | 1.3 |
| Crosslinking aid | 1.0 |
| Silane coupling agent | 0.5 |
| Ultraviolet absorber | 0.2 |

TABLE 2

<Crosslinking aid>

| Symbol | Compound | Produced by |
|---|---|---|
| EB1290 | 6-functional urethane acrylate | Daicel-Cytec Co., Ltd. |
| KRM8452 | 10-functional urethane acrylate | Daicel-Cytec Co., Ltd. |
| TAIC | triallyl isocyanurate | Nippon Kasei Chemical Co., Ltd. |

TABLE 3

<Measuring device and measuring method>

| | |
|---|---|
| Super-insulating meter | SM-8220 (HIOKI E.E. Corp.) |
| Electrode for flat samples | SME-8310 (HIOKI E.E. Corp.) |
| Measuring method | A sample film was charged at applied voltage of 1000 V (AV.) for one min under environmental conditions of 24 to 25° C. and 20 to 22% RH. After that, power supply was stopped, and a volume resistivity value of the sample film was measured after 30 sec from the stop of power supply. A volume resistivity of the sample film was calculated from the thus measured value. |

TABLE 4

<Evaluation results>

| | Crosslinking aid | Volume resistivity at 1000 V |
|---|---|---|
| Example 1 | EB-1290 | 4.78E+15 |
| Example 2 | KRM 8452 | 5.72E+15 |
| Comparative Example 1 | TAIC | 0.77E+15 |

The invention claimed is:

1. A solar cell comprising a sealing material consisting of a heat-crosslinkable resin composition consisting of:
    an ethylene copolymer selected from the group consisting of ethylene-vinyl acetate copolymers, ethylene-unsaturated carboxylic acid ester copolymers, and mixtures thereof,
    an organic peroxide as a crosslinking agent, and
    a urethane poly(meth)acrylate as a crosslinking aid,
    wherein:
    an amount of the urethane poly(meth)acrylate in the heat-crosslinkable resin composition is 0.1 to 2.0 parts by weight based on 100 parts by weight of the ethylene copolymer;
    an amount of the organic peroxide in the heat-crosslinkable resin composition is 0.6 to 2.0 parts by weight based on 100 parts by weight of the ethylene copolymer; and
    the average molecular weight of the urethane poly(meth)acrylate is not less than 1000.

2. A solar cell comprising a sealing material consisting of a heat-crosslinkable resin composition consisting of
    an ethylene copolymer selected from the group consisting of ethylene-vinyl acetate copolymers, ethylene-unsaturated carboxylic acid ester copolymers, and mixtures thereof,
    an organic peroxide as a crosslinking agent,
    a urethane poly(meth)acrylate as a crosslinking aid, and
    at least one additive selected from the group consisting of reinforcing agents, plasticizers, processing aids, lubricants, pigments, anti-aging agents, coupling agents, and acid acceptors,
    wherein:
    an amount of the urethane poly(meth)acrylate in the heat-crosslinkable resin composition is 0.1 to 2.0 parts by weight based on 100 parts by weight of the ethylene copolymer;
    an amount of the organic peroxide in the heat-crosslinkable resin composition is 0.6 to 2.0 parts by weight based on 100 parts by weight of the ethylene copolymer; and
    the average molecular weight of the urethane poly(meth)acrylate is not less than 1000.

* * * * *